United States Patent
Yan et al.

(10) Patent No.: US 12,159,871 B2
(45) Date of Patent: Dec. 3, 2024

(54) NITRIDE-BASED MULTI-CHANNEL SWITCHING SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Hui Yan, Suzhou (CN); Sichao Li, Suzhou (CN); Dinghui Cai, Suzhou (CN); Jihua Li, Suzhou (CN); Yulin Chen, Suzhou (CN); Tao Zhang, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 252 days.

(21) Appl. No.: 17/625,094

(22) PCT Filed: Jul. 1, 2021

(86) PCT No.: PCT/CN2021/103963
§ 371 (c)(1),
(2) Date: Jan. 6, 2022

(87) PCT Pub. No.: WO2023/272674
PCT Pub. Date: Jan. 5, 2023

(65) Prior Publication Data
US 2023/0352487 A1 Nov. 2, 2023

(51) Int. Cl.
*H01L 27/095* (2006.01)
*H01L 21/8252* (2006.01)
(Continued)

(52) U.S. Cl.
CPC ........ *H01L 27/095* (2013.01); *H01L 21/8252* (2013.01); *H01L 23/3171* (2013.01);
(Continued)

(58) Field of Classification Search
CPC ............... H01L 27/095; H01L 23/3171; H01L 23/3192; H01L 23/522; H01L 21/8252;
(Continued)

(56) References Cited

U.S. PATENT DOCUMENTS 6,346,728 B1 * 2/2002 Inoue ...................... H01L 24/45
257/341
6,683,380 B2 1/2004 Efland et al.
(Continued)

FOREIGN PATENT DOCUMENTS

CN 105280700 A 1/2016
CN 107768439 A 3/2018
(Continued)

OTHER PUBLICATIONS

International Search Report and Written Opinion of the corresponding PCT application No. PCT/CN2021/103963 mailed on Mar. 30, 2022.

*Primary Examiner* — Alonzo Chambliss
(74) *Attorney, Agent, or Firm* — Li & Cai Intellectual Property (USA) Office

(57) ABSTRACT

The present invention provides a nitride-based multi-channel switching device having a plurality of transistors. The multi-channel switching device comprises a substrate, a plurality gate structures, a plurality of source electrodes and a plurality of drain electrodes. The gate structures, source electrodes and drain electrodes are grouped to form the plurality of transistors and arranged such that each gate structure disposed between a source electrode and drain electrode. Each group of the gate structures are electrically (Continued)

interconnected and connected to at least one gate pad corresponding to each of the transistor. Each group of the drain electrode are electrically interconnected and connected to at least one drain pad corresponding to each of the transistor. All groups of the source electrodes are electrically interconnected and connected to at least one common source pad.

11 Claims, 15 Drawing Sheets

(51) Int. Cl.
  *H01L 23/31*    (2006.01)
  *H01L 23/522*   (2006.01)
  *H01L 29/08*    (2006.01)
  *H01L 29/20*    (2006.01)
  *H01L 29/423*   (2006.01)
  *H01L 29/66*    (2006.01)
  *H01L 29/778*   (2006.01)

(52) U.S. Cl.
  CPC ...... *H01L 23/3192* (2013.01); *H01L 23/5226* (2013.01); *H01L 29/0843* (2013.01); *H01L 29/2003* (2013.01); *H01L 29/4238* (2013.01); *H01L 29/66462* (2013.01); *H01L 29/7786* (2013.01)

(58) Field of Classification Search
  CPC ........... H01L 29/2003; H01L 29/66462; H01L 29/7786; H01L 29/4238; H01L 29/0843
  See application file for complete search history.

(56) References Cited

U.S. PATENT DOCUMENTS

| | | | |
|---|---|---|---|
| 6,972,464 B2 | 12/2005 | Shen | |
| 8,446,005 B2 | 5/2013 | Yokouchi | |
| 9,906,221 B1 | 2/2018 | Yang | |
| 2002/0011674 A1 | 1/2002 | Efland et al. | |
| 2012/0235209 A1* | 9/2012 | Briere | ................ H01L 27/0605 |
| | | | 257/E27.061 |
| 2012/0313147 A1 | 12/2012 | Anderson et al. | |
| 2014/0306235 A1 | 10/2014 | Decoutere et al. | |
| 2015/0243657 A1 | 8/2015 | Lin et al. | |
| 2018/0026126 A1 | 1/2018 | Ramdani et al. | |
| 2019/0131214 A1* | 5/2019 | Lin | ........................ H01L 29/402 |
| 2020/0075726 A1 | 3/2020 | Liao et al. | |
| 2022/0139810 A1* | 5/2022 | Mizan | ............... H01L 29/41758 |
| | | | 257/76 |

FOREIGN PATENT DOCUMENTS

| | | |
|---|---|---|
| CN | 107852012 A | 3/2018 |
| CN | 110007895 A | 7/2019 |
| CN | 112331719 A | 2/2021 |
| CN | 112750898 A | 5/2021 |
| JP | 2012209763 A | 10/2012 |
| KR | 1020040031338 A | 4/2004 |

* cited by examiner

NITRIDE-BASED MULTI-CHANNEL SWITCHING SEMICONDUCTOR DEVICE AND METHOD FOR MANUFACTURING THE SAME

TECHNICAL FIELD

The present invention generally relates to a nitride-based semiconductor switching device. More specifically, the present invention relates to a nitride-based semiconductor multi-channel switching device integrated in a semiconductor chip.

BACKGROUND

Gallium nitride (GaN)-based devices have been widely used for high frequency electrical energy conversion systems because of low power losses and fast switching transition. In comparison with silicon metal oxide semiconductor field effect transistor (MOSFET), GaN high-electron-mobility transistor (HEMT) has a much better figure of merit and more promising performance for a variety of power supply applications.

With the market's increasing data processing capacity and speed in various applications such as 5G communication network and light detection and ranging (LiDAR) systems, there is always demand for low-voltage, high-current multi-channel power supplies. LLC resonant power supply is one the commonly used power supply architectures in which a transformer with an array of secondary windings is used for providing large current output at low voltage. Conventionally, each of the secondary windings is coupled to a discrete power switching device mounted on a printed circuit board. With the increase in number of switching devices, the power supply circuit usually occupies a large board area. Furthermore, interconnection between the discrete switching devices will also possess parasitic elements which affect the efficiency and reliability of the overall system.

SUMMARY

One objective of the present invention is to provide a high-performance nitride-based multi-channel switching device, which is free of parasitic elements and compact in size, for low-voltage and high-current power supply or multi-channel power supply applications.

In accordance with one aspect of the present invention, a nitride-based multi-channel switching device having a plurality of transistors is provided. The multi-channel switching device comprises a substrate, a plurality gate structures, a plurality of source electrodes and a plurality of drain electrodes. The gate structures, source electrodes and drain electrodes are grouped to form the plurality of transistors and arranged such that each gate structure disposed between a source electrode and drain electrode. Each group of the gate structures are electrically interconnected and connected to at least one gate pad corresponding to each of the transistor. Each group of the drain electrode are electrically interconnected and connected to at least one drain pad corresponding to each of the transistor. All groups of the source electrodes are electrically interconnected and connected to at least one common source pad.

Compared to conventional configuration in which discrete switching devices are mounted and interconnected through a printed circuit board, the present invention integrates the switching devices into a single semiconductor chip such that the parasitic issues caused by the PCB layout can be avoided. The resultant power supply system has therefore higher efficiency and reliability. Moreover, the size of the power supply system can be greatly reduced.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

In the following description, embodiments of nitride-based multi-channel switching device and method for manufacturing the same are set forth as preferred examples in accordance with the subject application. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Reference in this specification to "one embodiment" or "an embodiments" means that a particular feature, structure, or characteristic described in connection with the embodiment is included in at least one of the embodiments of the invention. The appearances of the phrase "in one embodiment" or "in some embodiments" in various places in the specifications are not necessarily all referring to the same embodiments, nor are separate or alternative embodiments mutually exclusive of other embodiments. Moreover, various features are described which may be exhibited by some embodiments and not by others.

Figure 1:
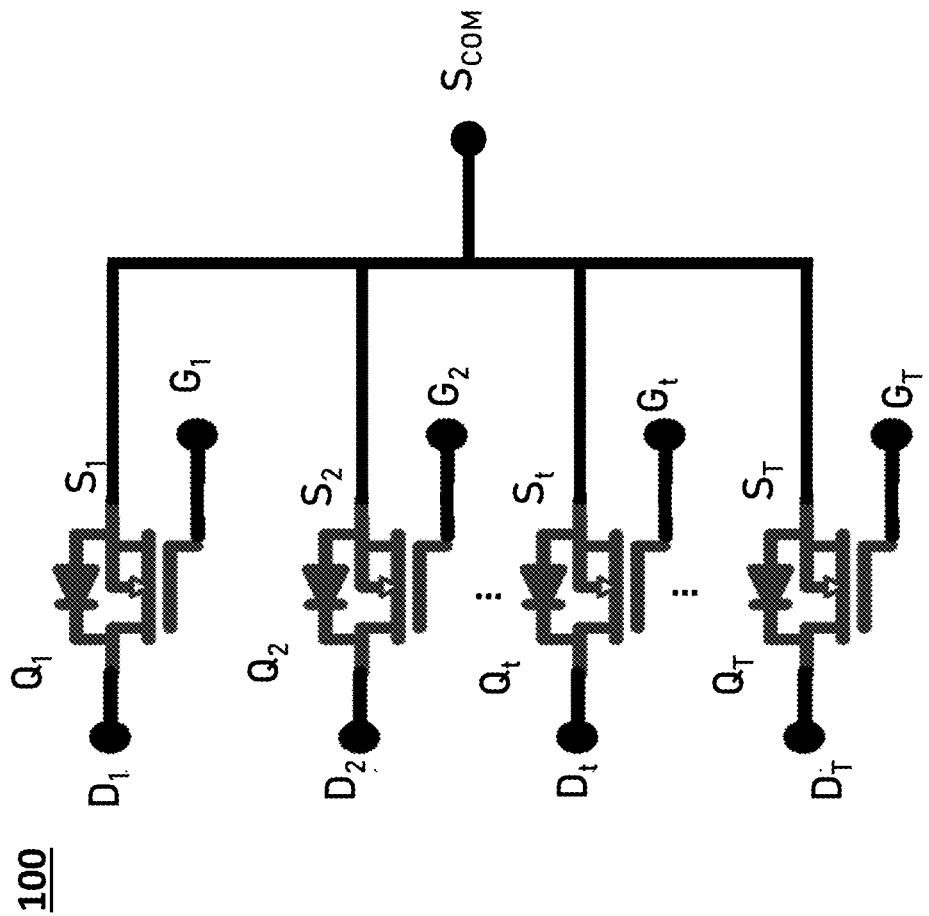
FIG. 1 depicts a circuit diagram of a nitride-based multi-channel switching device according to one embodiment of the subject application.

FIG. 1 depicts a circuit diagram of a nitride-based multi-channel switching device 100 according to one embodiment of the subject application.

Referring to FIG. 1, the nitride-based multi-channel switching device 100 may comprise a plurality of transistors Qt, where t=1, 2, . . . , T, and T is the total number of transistors. The $t^{th}$ transistor Qt may have a gate terminal Gt, a drain terminal Dt and a source terminal St. The source terminals $S_1, S_2, \ldots, S_T$ are electrically interconnected to form a common source terminal $S_{COM}$.

Each of the transistors Qt may be constructed with various types of transistors, including but not limited to, GaN-based HEMT devices and silicon power metal on silicon (MOS).

Figure 2:
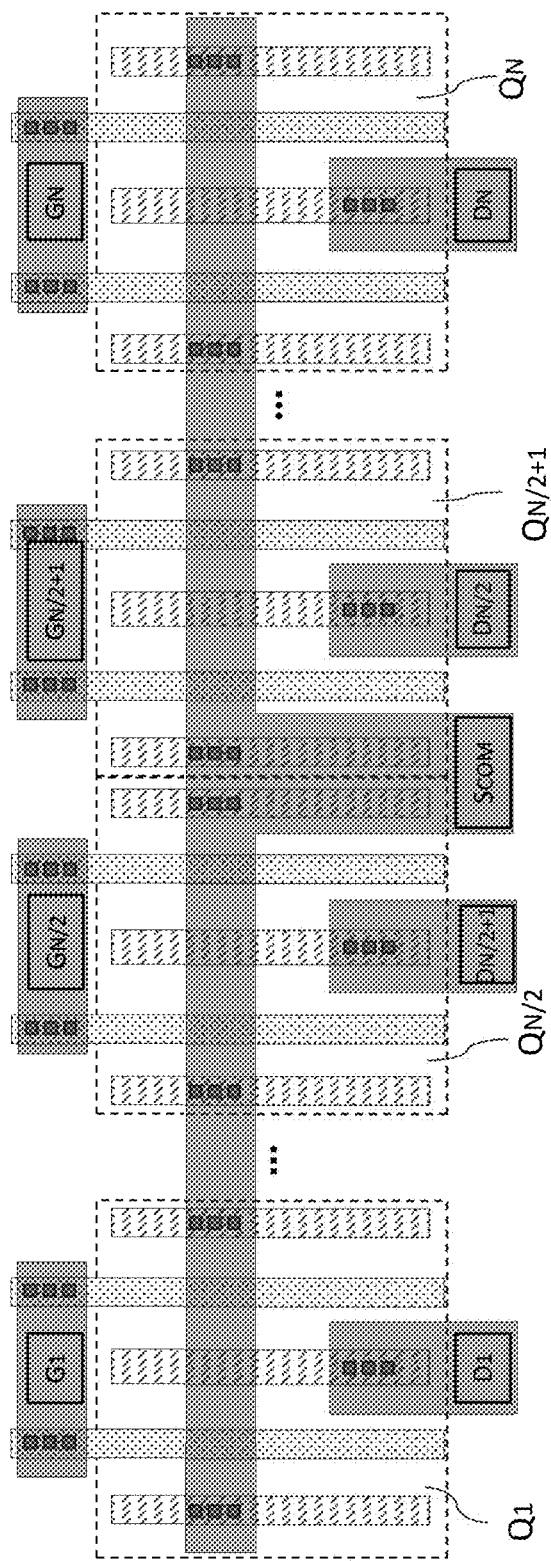
FIG. 2 depicts the nitride-based multi-channel switching device of FIG. 1 with its transistors arranged in a one-dimensional array on a semiconductor chip.

In some embodiments, the plurality of transistors of the nitride-based multi-channel switching device 100 may be integrated in a single semiconductor chip and arranged in a one-dimensional 1×N array as shown in FIG. 2. For illustration purpose, the transistors are denoted as [$Q_1$, $Q_2, \ldots, Q_N$], N is equal to T which is the total number of transistors in the multi-channel switching device. The multi-channel switching device has a row of N number of gate terminals represented as $G_1, G_2, \ldots, G_N$, a row of N number of drain terminals represented as $D_1, D_2, \ldots, D_N$; and a common source terminal represented as $S_{COM}$.

Preferably, the common source terminal $S_{COM}$ is located at a central region of the semiconductor chip. More specifically, the common source terminal $S_{COM}$ is preferably disposed in a location between the $S_{COM}$ transistors $Q_{N/2}$ and $Q_{N/2+1}$.

Figure 3:
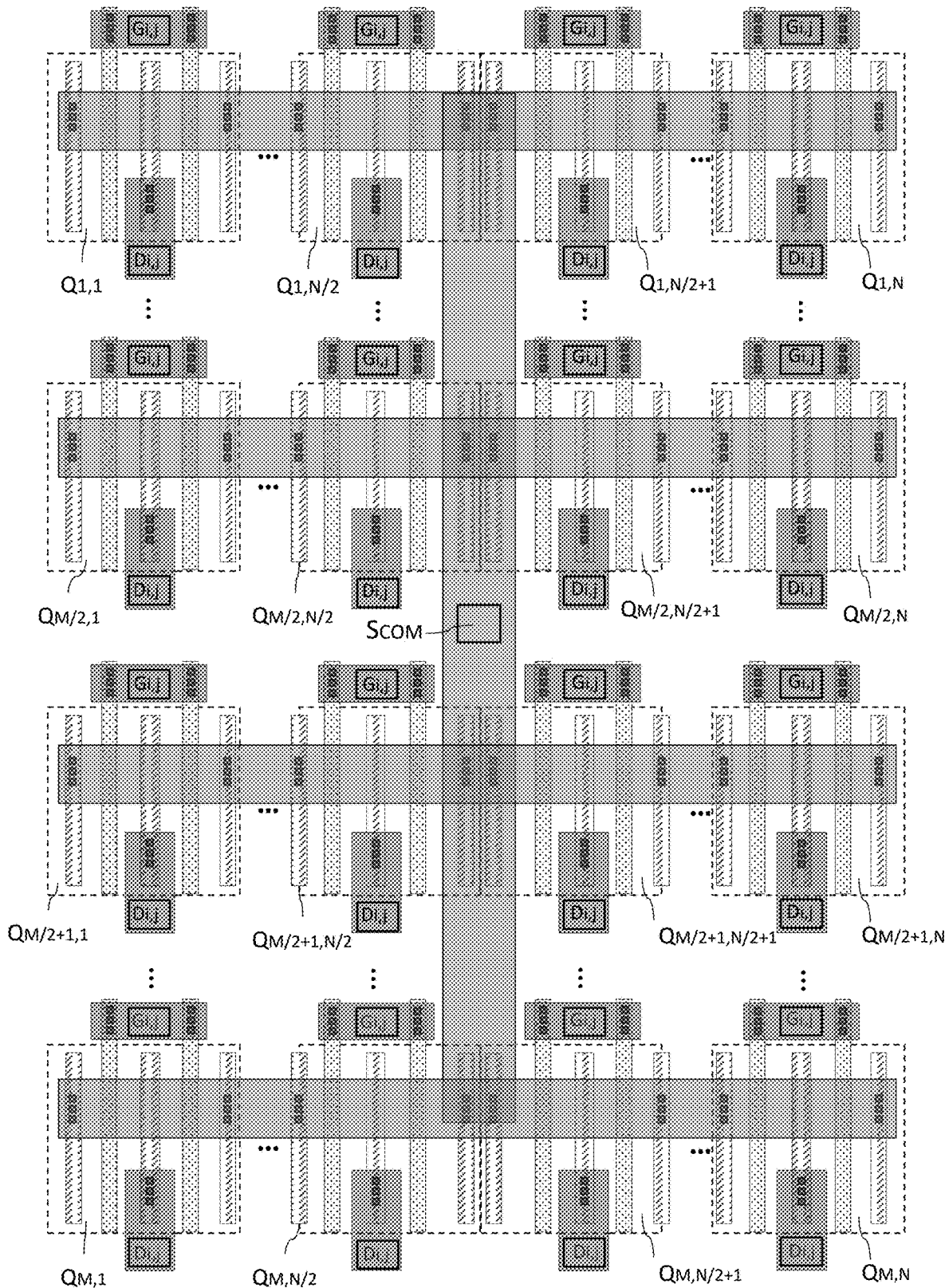
FIG. 3 depicts the nitride-based multi-channel switching device of FIG. 1 with its transistors arranged in a two-dimensional array on a semiconductor chip.

In some embodiments, the plurality of transistors of the multi-channel switching device 100 may be integrated in a single semiconductor chip and arranged in a two-dimensional M×N array as shown in FIG. 3. For illustration purpose, the transistors are denoted as elements of a matrix:

$$\begin{pmatrix} Q_{1,1} & \cdots & Q_{1,N} \\ \vdots & \ddots & \vdots \\ Q_{M,1} & \cdots & Q_{M,N} \end{pmatrix},$$

where M is the total number of rows of transistors and N is the total number of columns of transistor. The product of M×N is equal to T which is the total number of transistors in the multi-channel switching device 100. The multi-channel switching device 100 has a two-dimensional array of M×N gate terminals, $G_{i,j}$; a two-dimensional array of M×N drain terminals, $D_{i,j}$; and a common source terminal denoted as $S_{COM}$.

Preferably, the common source terminal $S_{COM}$ is located at a central region of the semiconductor chip. More specifically, the common source terminal $S_{COM}$ is preferably is preferably disposed in a location surrounded by the transistors $Q_{M/2,N/2}$, $Q_{M/2+1,N/2}$, $Q_{M/2,N/2+1}$, $Q_{M/2+1,N/2+1}$.

Figure 4:
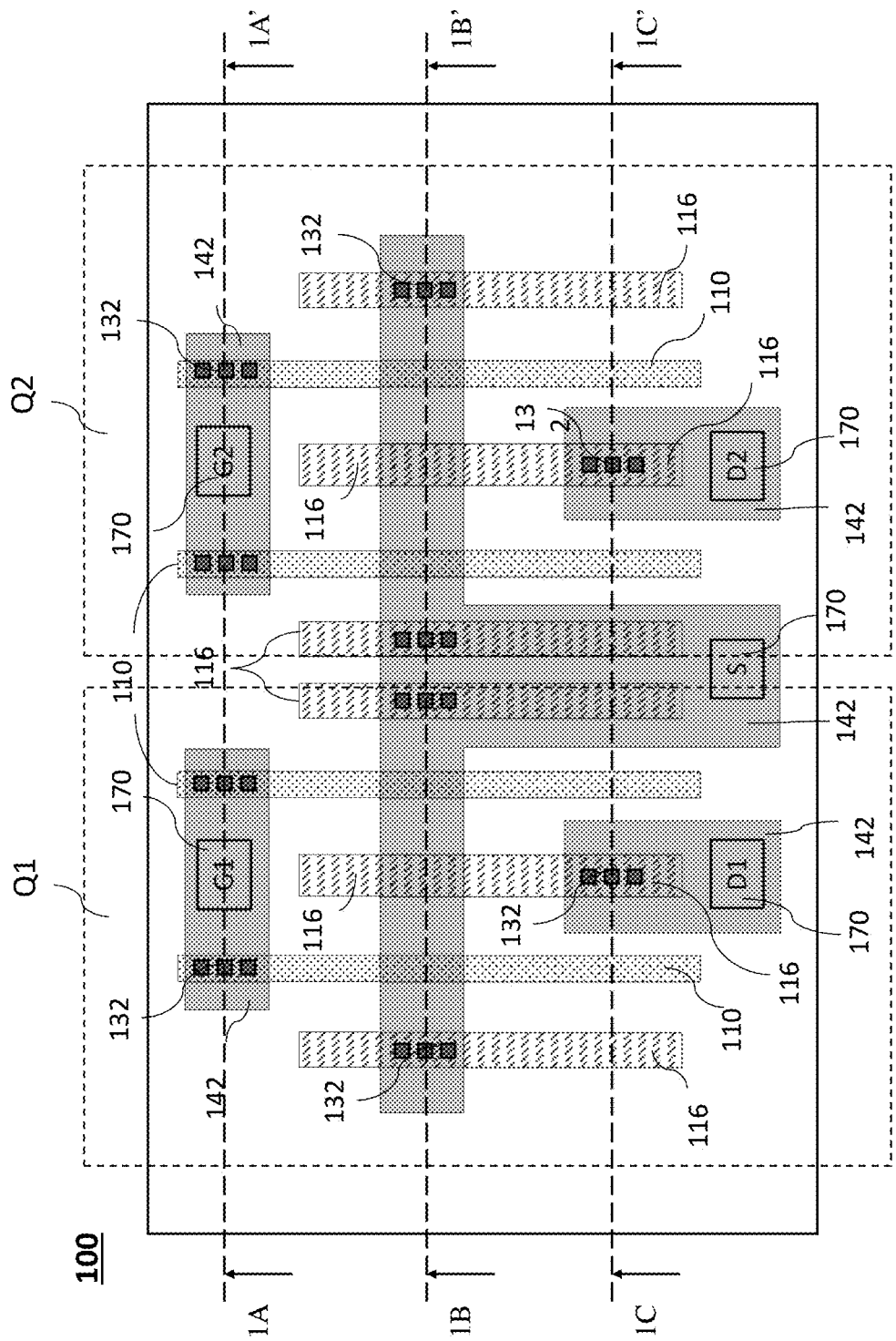
FIG. 4 is a partial layout of an exemplary structure of the nitride-based multi-channel switching device of FIG. 1.
Figure 5A:
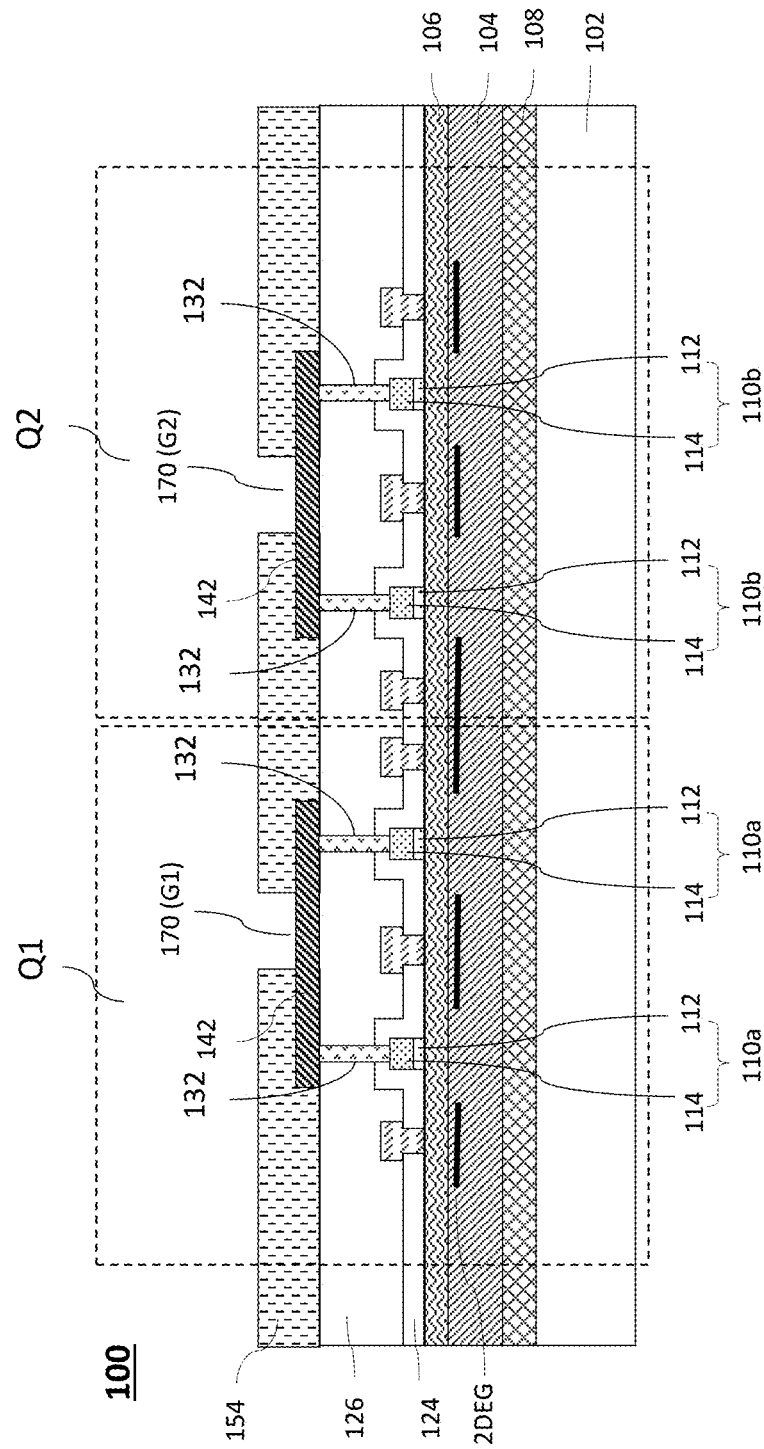
FIGS. 5A-5C are cross-sectional views taken along lines A-A', B-B' and C-C' in FIG. 4 respectively.
Figure 5B:
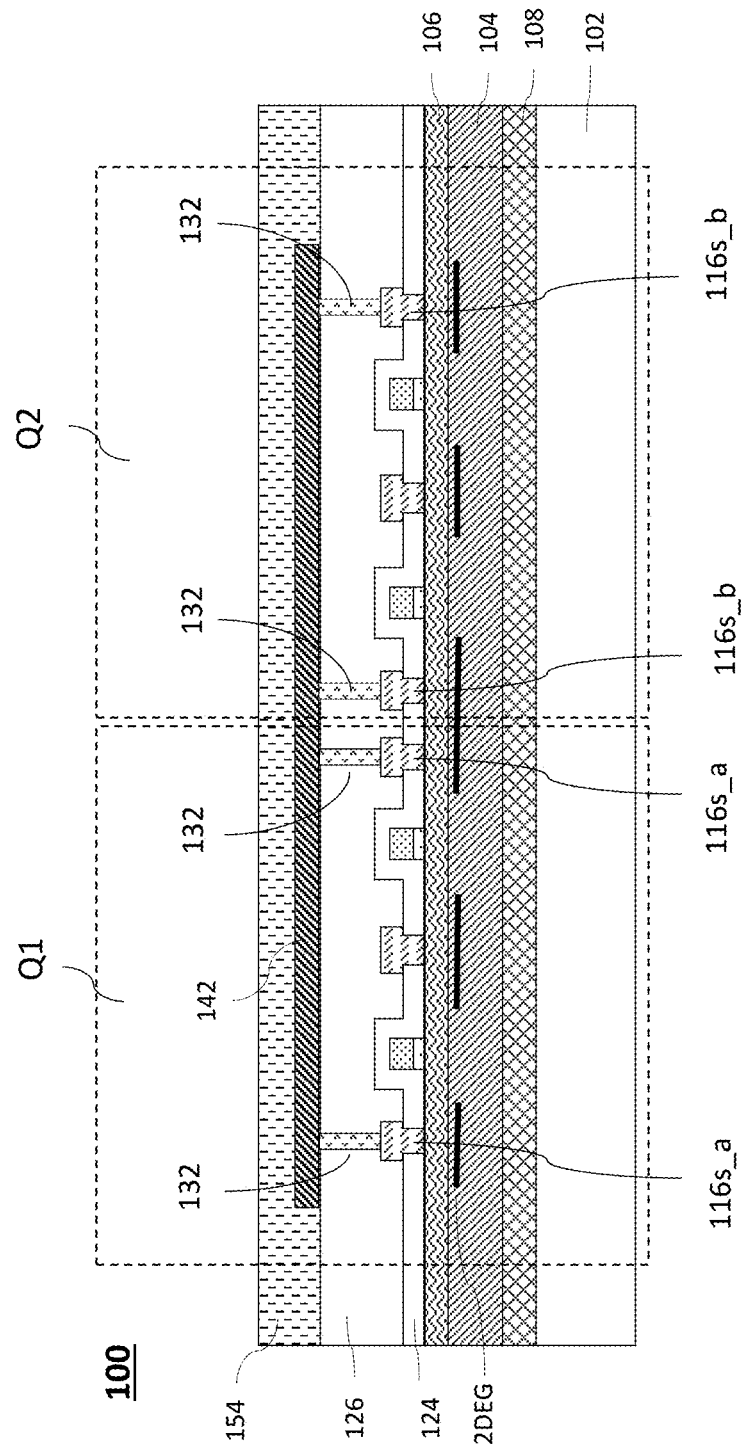
Figure 5C:
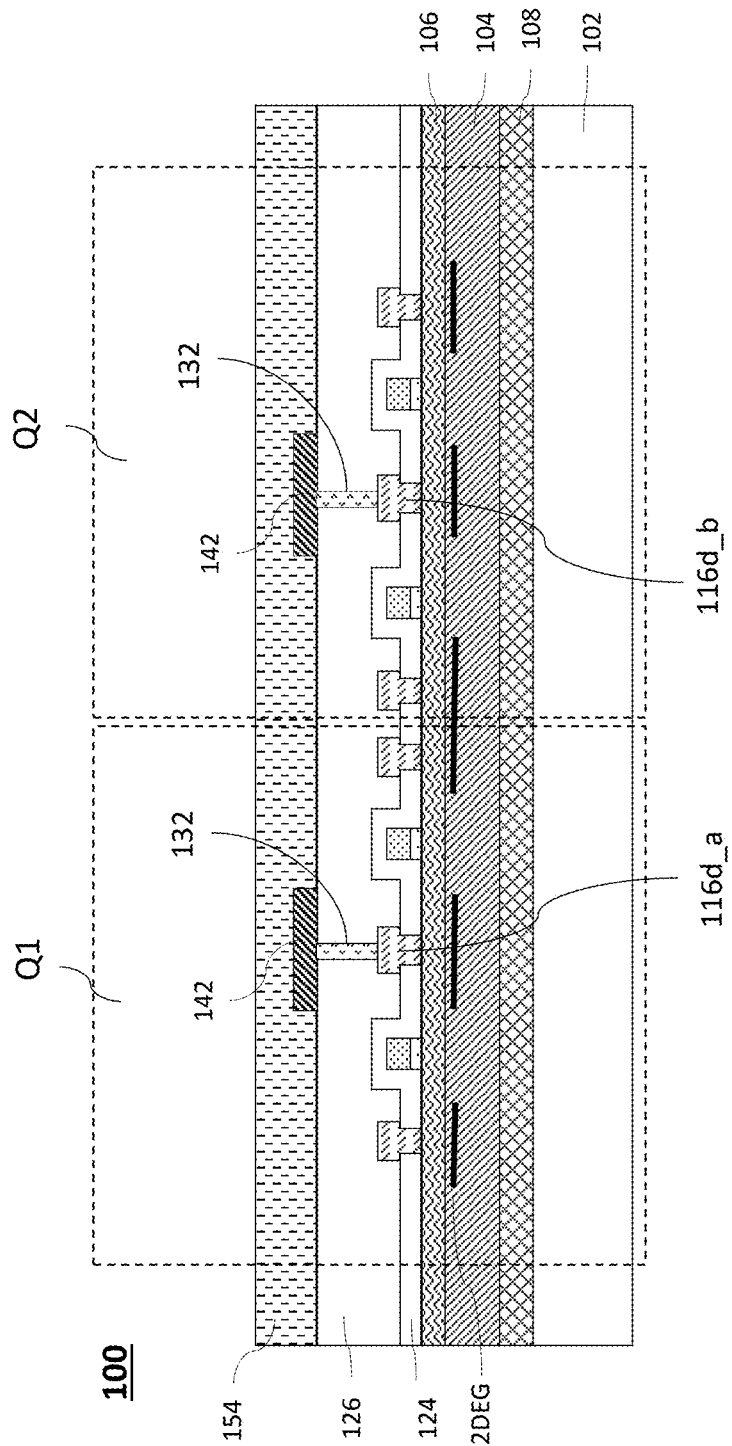

FIGS. 4 and 5A-5C depict an exemplary structure of the nitride-based multi-channel switching device 100 of FIG. 1. For simplicity, only two transistors, Q1 and Q2, are illustrated. FIG. 4 is a partial layout of the nitride-based multi-channel switching device 100 showing a relationship among some elements that constitute parts of the transistors Q1 and Q2. FIGS. 5A-5C are cross-sectional views taken along lines A-A', B-B' and C-C' in FIG. 4 respectively.

Referring to FIGS. 4 and 5A-5C, the nitride-based multi-channel switching device 100 may include a substrate 102, a first nitride-based semiconductor layer 104, a second nitride-based semiconductor layer 106, gate structures 110, source/drain (S/D) electrodes 116, a first passivation layer 124, a second passivation layer 126, one or more first conductive vias 132, one or more first conductive traces 142, a protection layer 154 and one or more conductive pads 170.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 104 is disposed over the substrate 102. The exemplary materials of the nitride-based semiconductor layer 104 can include, for example but are not limited to, nitrides or group III-V compounds, such as GaN, AlN, InN, $InxAl_yGa_{(1-x-y)}N$ where x+y≤1, $Al_yGa_{(1-y)}N$ where y≤1. The exemplary structures of the nitride-based semiconductor layer 104 can include, for example but are not limited to, multilayered structure, superlattice structure and composition-gradient structures.

The nitride-based semiconductor layer 106 is disposed on the nitride-based semiconductor layer 104. The exemplary materials of the nitride-based semiconductor layer 106 can include, for example but are not limited to, nitrides or group III-V compounds, such as GaN, AlN, InN, $InxAl_yGa_{(1-x-y)}N$ where x+y≤1, $Al_yGa_{(1-y)}N$ where y≤1.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the multi-channel switching device is available to include one or more GaN-based high-electron-mobility transistors (HEMT).

In some embodiments, the multi-channel switching device 100 may further include a buffer layer 108, a nucleation layer (not illustrated), or a combination thereof. The buffer layer 108 can be disposed between the substrate 102 and the nitride-based semiconductor layer 104. The buffer layer 108 can be configured to reduce lattice and thermal mismatches between the substrate 102 and the nitride-based semiconductor layer 104, thereby curing defects due to the mismatches/difference. The buffer layer 108 may include a III-V compound. The III-V compound can include, for example but are not limited to, aluminum, gallium, indium, nitrogen, or combinations thereof. Accordingly, the exemplary materials of the buffer layer 108 can further include, for example but are not limited to, GaN, AlN, AlGaN, InAlGaN, or combinations thereof.

The nucleation layer may be formed between the substrate 102 and the buffer layer 108. The nucleation layer can be configured to provide a transition to accommodate a mismatch/difference between the substrate 102 and a III-nitride layer of the buffer layer 108. The exemplary material of the nucleation layer can include, for example but is not limited to AlN or any of its alloys.

The gate structures 110 are disposed on/over/above the second nitride-based semiconductor layer 106. Each of the gate structures 110 may include an optional gate semiconductor layer 112 and a gate metal layer 114. The gate semiconductor layer 112 and the gate metal layer 114 are stacked on the nitride-based semiconductor layer 106. The gate semiconductor layer 112 is between the nitride-based semiconductor layer 106 and the gate metal layer 114. The gate semiconductor layer 112 and the gate metal layer 114 may form a Schottky barrier. In some embodiments, the multi-channel switching device 100 may further include an optional dielectric layer (not illustrated) between the p-type doped III-V compound semiconductor layer 112 and the gate metal layer 114.

The transistors Q1 and Q2 may be enhancement mode devices, which are in a normally-off state when their gate electrodes 114 are at approximately zero bias. Specifically, the gate semiconductor layer 112 may be a p-type doped III-V compound semiconductor layer. The p-type doped III-V compound semiconductor layer 112 may create at least one p-n junction with the nitride-based semiconductor layer 106 to deplete the 2DEG region, such that at least one zone of the 2DEG region corresponding to a position below the corresponding gate structure 110 has different characteristics (e.g., different electron concentrations) than the rest of the 2DEG region and thus is blocked. Due to such mechanism, the multi-channel switching device 100 has a normally-off characteristic. In other words, when no voltage is applied to the gate electrodes 114 or a voltage applied to the gate electrodes 114 is less than a threshold voltage (i.e., a minimum voltage required to form an inversion layer below the gate structures 110), the zone of the 2DEG region below the gate structures 110 is kept blocked, and thus no current flows therethrough. Moreover, by providing the p-type doped III-V compound semiconductor layers 112, gate leakage current is reduced and an increase in the threshold voltage during the off-state is achieved.

In some embodiments, the p-type doped III-V compound semiconductor layers 112 can be omitted, such that the multi-channel switching device 100 is a depletion-mode device, which means the transistors are in a normally-on state at zero gate-source voltage.

The exemplary materials of the p-type doped III-V compound semiconductor layers 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg.

In some embodiments, the nitride-based semiconductor layer 104 includes undoped GaN and the nitride-based semiconductor layer 106 includes AlGaN, and the p-type doped III-V compound semiconductor layers 112 are p-type GaN layers which can bend the underlying band structure upwards and to deplete the corresponding zone of the 2DEG region, so as to place the multi-channel switching device 100 into an off-state condition.

In some embodiments, the gate electrodes 114 may include metals or metal compounds. The gate electrodes 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 114 may include, for example but are not limited to, nitrides, oxides, silicides, doped semiconductors, or combinations thereof.

In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc.), or combinations thereof.

The S/D electrodes 116 are disposed on the nitride-based semiconductor layer 106. The "S/D" electrode means each of the S/D electrodes 116 can serve as a source electrode or a drain electrode, depending on the device design. The S/D electrodes 116 can be located at two opposite sides of the corresponding gate structure 110 although other configurations may be used, particularly when plural source, drain, or gate electrodes are employed in the device. Each of the gate structure 110 can be arranged such that each of the gate structure 110 is located between at least two of the S/D electrodes 116. The gate structures 110 and the S/D electrodes 116 can collectively act as at least one nitride-based/GaN-based HEMT with the 2DEG region.

In the exemplary illustration, for each of the transistors Q1 and Q2, the adjacent S/D electrodes 116 are symmetrical about the gate structure 110 therebetween. In some embodiments, the adjacent S/D electrodes 116 can be optionally asymmetrical about the gate structure 110 therebetween. That is, one of the S/D electrodes 116 may be closer to the gate structure 110 than another one of the S/D electrodes 116.

In some embodiments, the S/D electrodes 116 can include, for example but are not limited to, metals, alloys, doped semiconductor materials (such as doped crystalline silicon), compounds such as silicides and nitrides, other conductor materials, or combinations thereof. The exemplary materials of the S/D electrodes 116 can include, for example but are not limited to, Ti, AlSi, TiN, or combinations thereof. The S/D electrodes 116 may be a single layer, or plural layers of the same or different composition. In some embodiments, the S/D electrodes 116 may form ohmic contacts with the nitride-based semiconductor layer 106. The ohmic contact can be achieved by applying Ti, Al, or other suitable materials to the S/D electrodes 116. In some embodiments, each of the S/D electrodes 116 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 124 is disposed over the nitride-based semiconductor layer 106. The passivation layer 124 can be formed for a protection purpose or for enhancing the electrical properties of the device (e.g., by providing an electrically isolation effect between/among different layers/elements). The passivation layer 124 covers a top surface of the nitride-based semiconductor layer 106. The passivation layer 124 may cover the gate structures 110. The passivation layer 124 can at least cover opposite two sidewalls of the gate structures 110. The S/D electrodes 116 can penetrate/pass through the passivation layer 124 to contact the nitride-based semiconductor layer 106. The exemplary materials of the passivation layer 124 can include, for example but are not limited to, $SiN_x$, $SiO_x$, $Si_3N_4$, SiON, SiC, SiBN, SiCBN, oxides, nitrides, poly(2-ethyl-2-oxazoline) (PEOX), or combinations thereof. In some embodiments, the passivation layer 124 can be a multi-layered structure, such as a composite dielectric layer of $Al_2O_3$/SiN, $Al_2O_3$/$SiO_2$, AlN/SiN, AlN/$SiO_2$, or combinations thereof.

The passivation layer 126 is disposed above the passivation layer 124 and the S/D electrodes 116. The passivation layer 126 covers the passivation layer 124 and the S/D electrodes 116. The passivation layer 126 can serve as a planarization layer which has a level top surface to support other layers/elements. The exemplary materials of the passivation layer 126 can include, for example but are not limited to, $SiN_x$, $SiO_x$, $Si_3N_4$, SiON, SiC, SiBN, SiCBN, oxides, PEOX, or combinations thereof. In some embodiments, the passivation layer 126 is a multi-layered structure, such as a composite dielectric layer of $Al_2O_3$/SiN, $Al_2O_3$/$SiO_2$, AlN/SiN, AlN/$SiO_2$, or combinations thereof.

The conductive vias 132 are disposed within the passivation layer 126 and passivation layer 124. The conductive vias 132 penetrate the passivation layer 126 and passivation layer 124. The conductive vias 132 extend longitudinally to electrically couple with the gate structure 110 and the S/D electrodes 116, respectively. The upper surfaces of the conductive vias 132 are free from coverage of the passivation layer 126. The exemplary materials of the conductive vias 132 can include, for example but are not limited to, conductive materials, such as metals or alloys.

The conductive traces 142 are disposed on the passivation layer 126 and the conductive vias 132. The conductive traces 142 are in contact with the conductive vias 132. The conductive traces 142 may be formed by patterning a conductive layer disposed on the passivation layer 126 and the conductive vias 132. The exemplary materials of the conductive traces 142 can include, for example but are not limited to, conductive materials. The conductive traces 142 may include a single film or multilayered film having Ag, Al, Cu, Mo, Ni, alloys thereof, oxides thereof, nitrides thereof, or combinations thereof.

The protection layer 154 is disposed above the passivation layer 128 and the conductive layer 146. The protection layer 154 covers the passivation layer 126 and the conductive traces 142. The protection layer 154 can prevent the conductive traces 142 from oxidizing. Some portions of the conductive traces 142 can be exposed through openings in the protection layer 154 to form the conductive pads 170, which are configured to electrically connect to external elements (e.g., an external circuit).

Conductive pads 170 may include: a first gate pad G1 configured to act as the first gate terminal; a second gate pad G2 configured to act as the second gate terminal; a first drain pad D1 configured to act as the first drain terminal; a second drain pad D2 configured to act as the second drain terminal; and a common source pad $S_{COM}$ to act as the common source terminal. Conductive traces 142 and conductive vias 132 may be configured to electrically connect different layers/elements to form the transistors Q1 and Q2.

Referring to FIGS. 4 and 5A. The gate structures 110 may include at least one first gate structure 110a configured to act as a gate of the first transistor Q1 and electrically connected to the first gate pad G1; and at least one second gate structure 110b configured to act as a gate of the second transistor Q2 and electrically connected to the second gate pad G2. The first and second gate structures 110a and 110b may be connected to the first and second gate pads G1 and G2 respectively through at least one conductive via 132 and at least one conductive trace 142.

Referring to FIGS. 4 and 5B. The S/D electrodes 116 may include at least one first source electrode 116s_a configured to act as a source of the first transistor Q1 and electrically connected to the common source pad $S_{COM}$; and at least one second source electrode 116s_b configured to act as a source of the second transistor Q2 and electrically connected to the common source pad $S_{COM}$. The first and second source electrodes 116s_a and 116s_b may be connected to the common source pad $S_{COM}$ through at least one conductive via 132 and at least one conductive trace 142 respectively.

Referring to FIGS. 4 and 5C. The S/D electrodes 116 may include at least one first drain 116d_a configured to act as a drain of the first transistor Q1 and electrically connected to the first drain pad D1; and at least one second drain electrode 116d_b configured to act as a drain of the second transistor Q2 and electrically connected to the second drain pad D2. The first and second drain electrodes 116d_a and 116d_b may be connected to the first and second drain pads D1 and D2 respectively through at least one conductive via 132 and at least one conductive trace 142.

The gate structures, source electrodes and drain electrodes are grouped to form each of the transistors and arranged such that each gate structure is disposed between a source electrode and drain electrode.

Different stages of a method for manufacturing the multi-channel switching device 100 are shown in FIGS. 6A-6G and described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes. The process for forming the passivation layers serving as a planarization layer generally includes a chemical mechanical polish (CMP) process. The process for forming the conductive vias generally includes forming vias in a passivation layer and filling the vias with conductive materials. The process for forming the conductive traces generally includes photolithography, exposure and development, etching, other suitable processes, or combinations thereof.

Figure 6A:
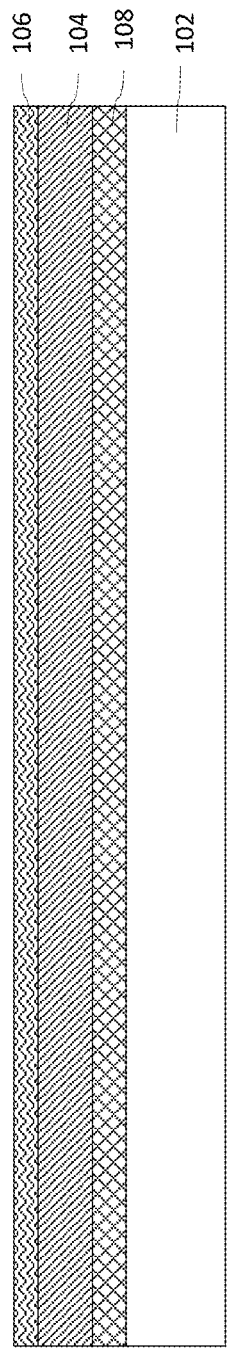
FIGS. 6A-6G show different stages of a method for manufacturing a multi-channel switching device according to one embodiment of the subject application.

Referring to FIG. 6A, a substrate 102 is provided. Buffer layer 108, nitride-based semiconductor layers 104 and 106 can be formed over the substrate 102 in sequence by using the above-mentioned deposition techniques.

In some embodiments, the buffer layer may be formed by forming at least one first layer of a doped nitride-based semiconductor compound at a top-most portion thereof; and forming a second layer located between the substrate and the first layer and including a nitride-based semiconductor compound which has a composition different than the doped nitride-based semiconductor compound.

A 2DEG region is formed adjacent to a heterojunction interface between the first nitride-based semiconductor layer 104 and the second nitride-based semiconductor layer 106.

Figure 6B:
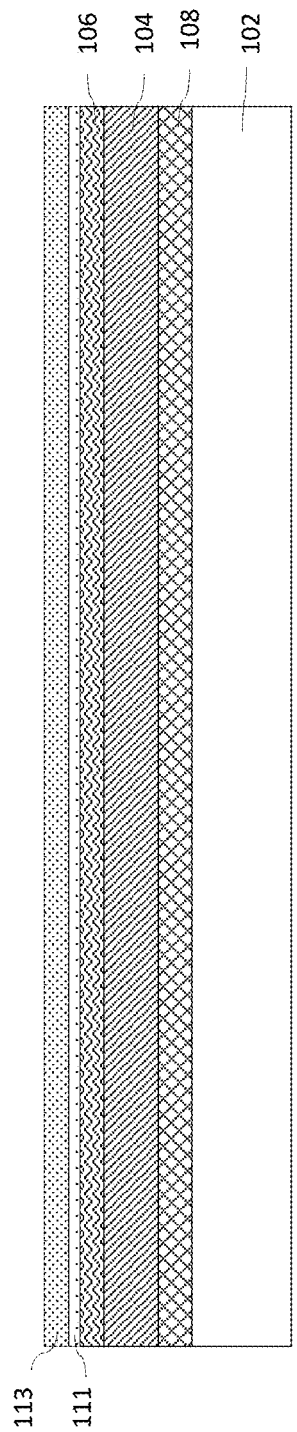

Referring to FIG. 6B, A blanket p-type doped III-V compound semiconductor layer 111 and a blanket gate electrode layer 113 can be formed above the nitride-based semiconductor layer 106 in sequence by using the above-mentioned deposition techniques.

Figure 6C:
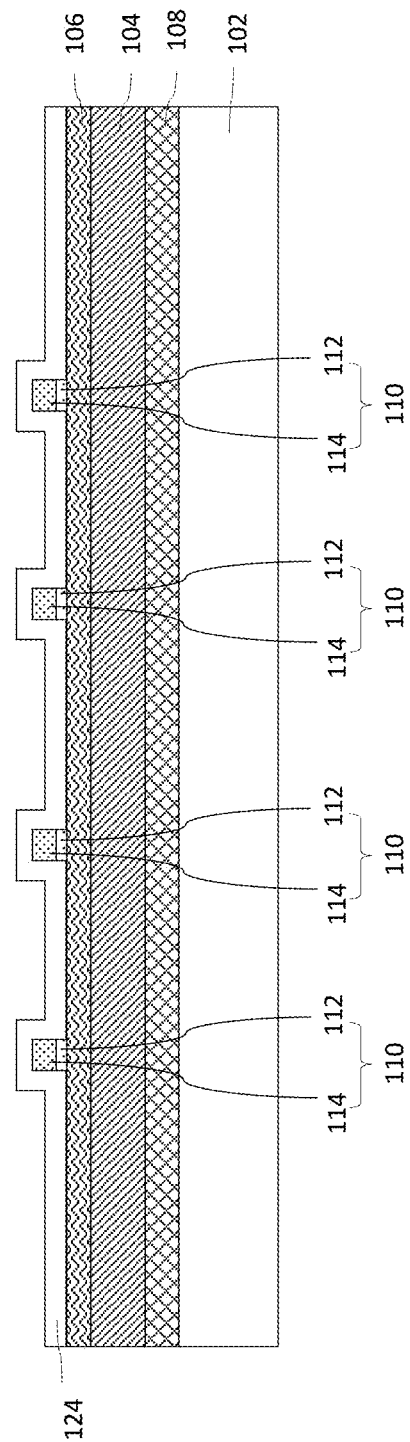

Referring to FIG. 6C, the blanket p-type doped III-V compound semiconductor layer 111 and the blanket gate electrode layer 113 are patterned to form a plurality of gate structures 110 over the nitride-based semiconductor layer 106. Each of the gate structures 110 includes a p-type doped III-V compound semiconductor layer 112 and a gate metal layer 114. A passivation layer 124 can then be formed to cover the of the gate structures 110 by using the above-mentioned deposition techniques.

Figure 6D:
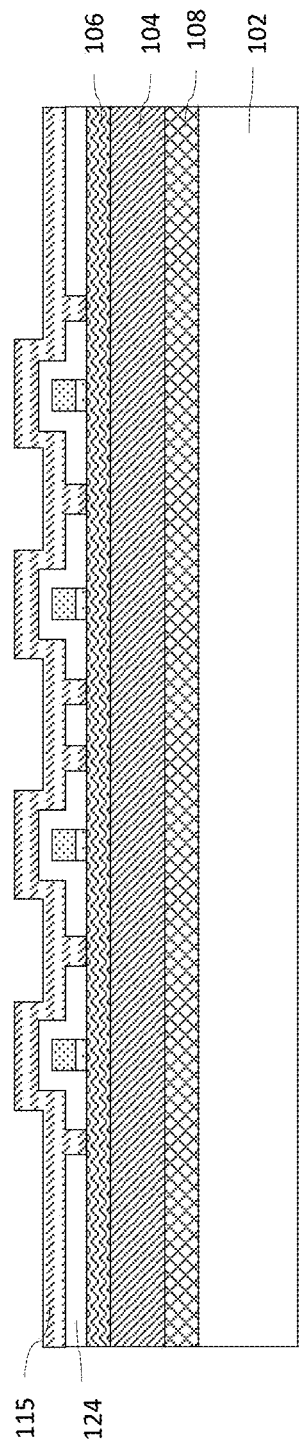

Referring to FIG. 6D, some S/D regions 160 are formed by removing some portions of the passivation layer 124. At least one portion of the nitride-based semiconductor layer 106 is exposed from the S/D regions 160. A blanket conductive layer 115 is formed to cover the nitride-based semiconductor layer 106 and the passivation layer 124, and fill the S/D regions 160, thereby contacting with the nitride-based semiconductor layer 106.

Figure 6E:
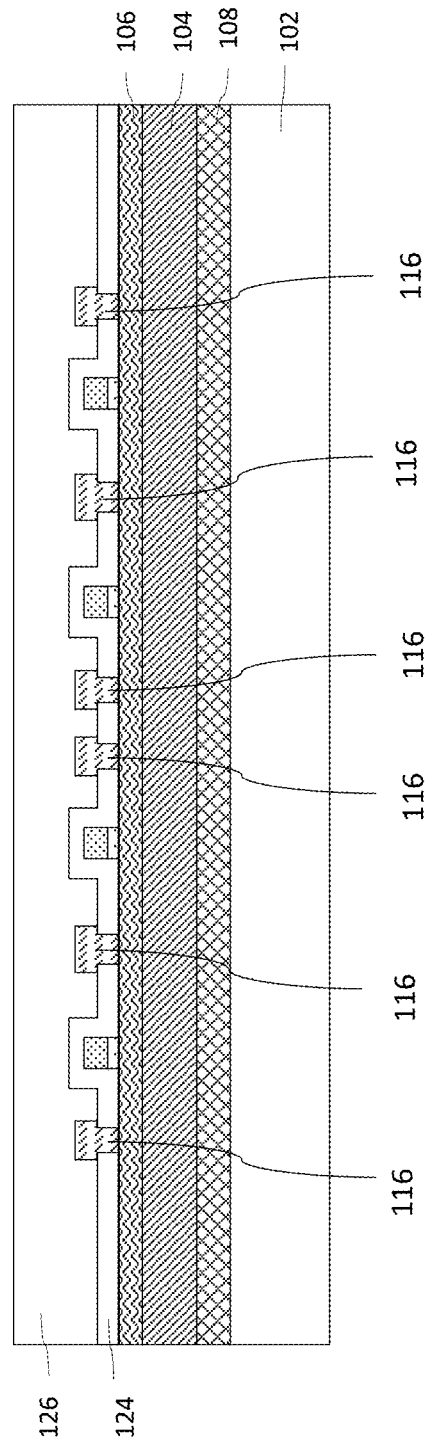

Referring to FIG. 6E, S/D electrodes 116 are formed by patterning the blanket conductive layer 115. Some portions of the blanket conductive layer 115 are removed, and rest of the blanket conductive layer 115 within the S/D regions 160 remains to serve as the S/D electrodes 116. A passivation layer 126 can then be formed on the passivation layer 124 to cover the S/D electrodes 116 by using the above-mentioned deposition techniques.

Figure 6F:
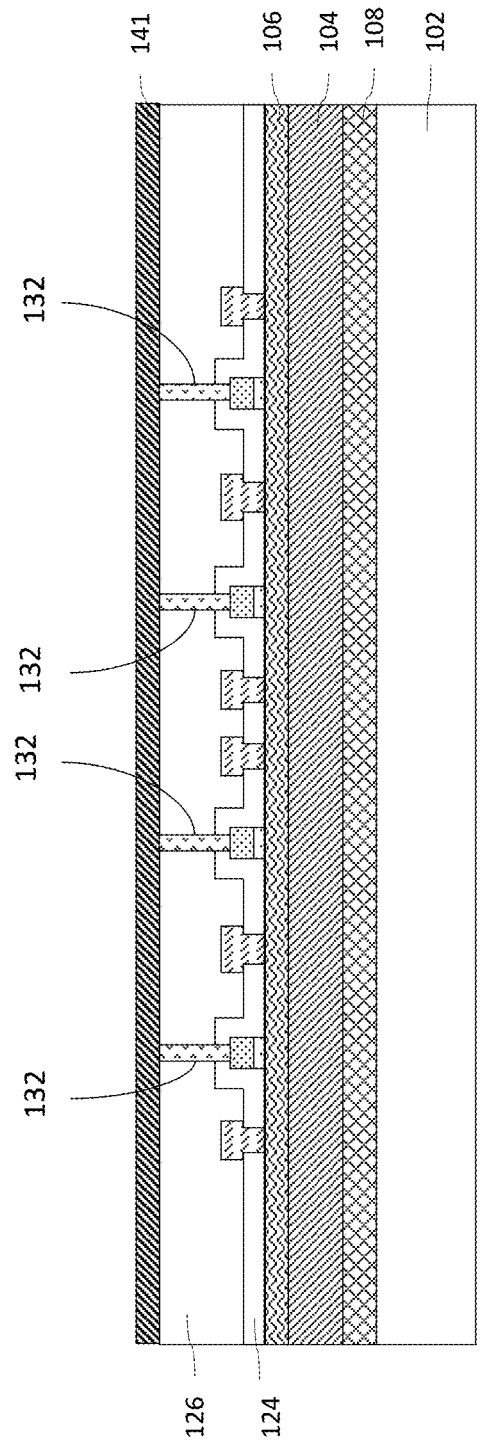

Referring to FIG. 6F, conductive vias 132 are formed to penetrate the passivation layers 126 and 124. A blanket conductive layer 141 is deposited on the passivation layer 126 by using the above-mentioned deposition techniques.

Figure 6G:
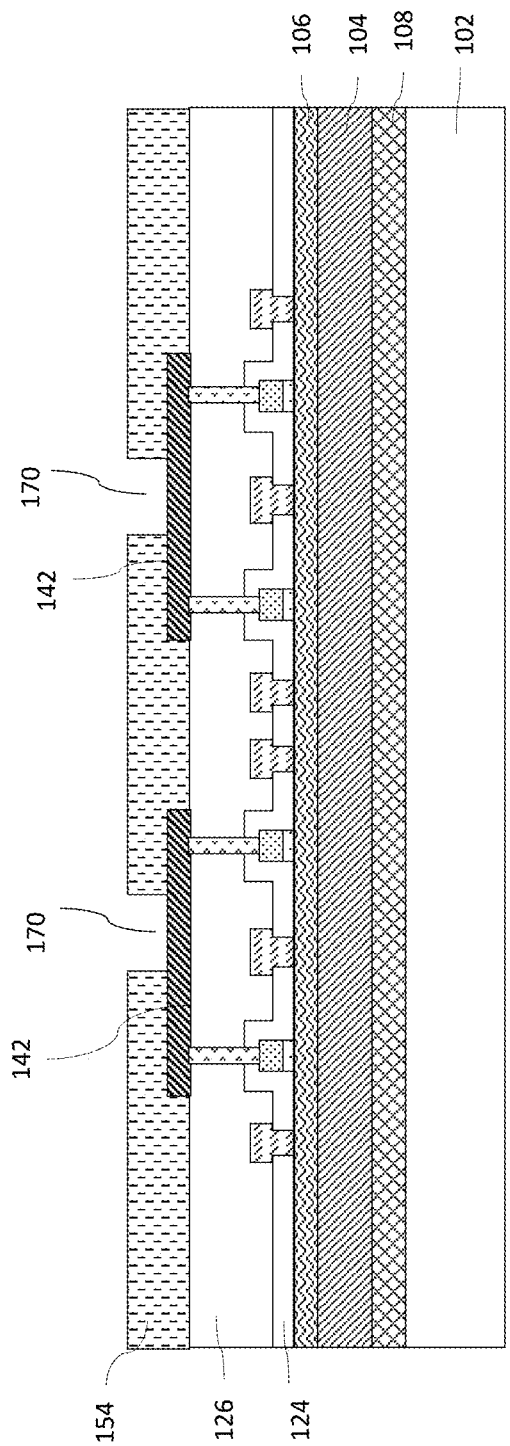

Referring to FIG. 6G, the blanket conductive layer 141 is patterned form conductive traces 142 over the passivation layer 126 and electrically coupled with the conductive vias 132. A protection layer 154 can then be formed on the passivation layer 126 to cover the conductive traces 142 and then be patterned to form one or more openings to expose one or more conductive pads 170.

Figure 7:
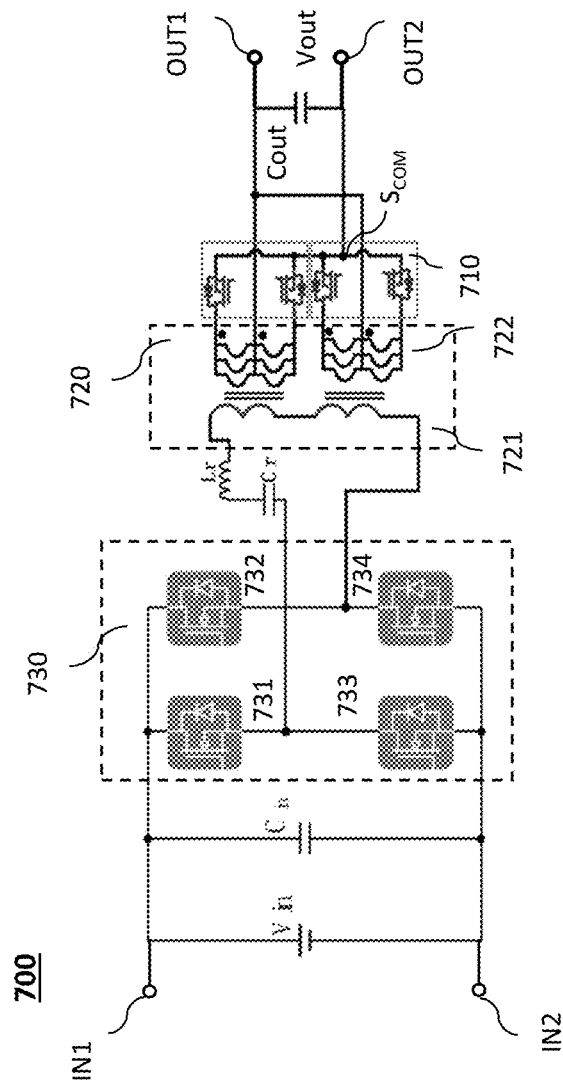
FIG. 7 depicts a multi-channel converter constructed with a multi-channel switching device according to one embodiment of the present invention.

FIG. 7 depicts a multi-channel converter 700 constructed with a multi-channel switching device 710 according to one embodiment of the present invention.

Referring to FIG. 7. The multi-channel converter 700 may comprise an input port configured to receive an input voltage Vin and having a first input node IN1 and a second input node IN2; an output port configured to provide an output voltage Vout and having a first output node OUT1 and a second output node OUT2. The multi-channel high-current converter 700 may further comprise an output capacitor Cout coupled across the output port; and an input capacitor Cin coupled across the input port.

The multi-channel switching device 710 may be constructed with an array of transistors. Each transistor may have a gate terminal, a drain terminal and a source terminal. The source terminals of the transistors are electrically interconnected to form a common source terminal $S_{COM}$. In other words, the multi-channel switching device 710 may have an array of gate terminals, an array of drain terminals and a common source terminal $S_{COM}$. The common source terminal $S_{COM}$ is connected to the second output node OUT2.

The multi-channel high-current converter 700 may further comprise a controller module (not shown) comprising a plurality of control nodes, each electrically coupled to a corresponding gate terminal of the multi-channel switching device 710.

The multi-channel high-current converter 700 may further comprise a transformer module 720 for voltage scaling and primary-secondary isolation. The transformer module 720 comprises a primary winding 721; and an array of secondary windings 722 magnetically coupled to the primary winding. Each of the secondary winding has a first terminal electrically connected to the first output node of the output port and a second terminal electrically connected to a corresponding drain terminal of the multi-channel switching device 710.

Preferably, the multi-channel high-current converter 700 may further comprise a switch network 730 coupled to the input port and configured for turning the input voltage into a square wave.

The multi-channel high-current converter 700 may further comprise a resonance LC circuit coupled between the switch network 730 and the primary winding 721, and configured for filtering out harmonics on the square wave to provide a sinusoidal like voltage and current waveform to the transformer module 720. Preferably, the resonance LC circuit may comprise an inductor Lr having a first terminal electrically connected to a first terminal of the primary winding 721; and a resonance capacitor Cr having a first terminal electrically connected to a second terminal of the resonance inductor Lr.

Preferably, the switch network 730 may be arranged to have a full-bridge topology comprising a first switching device 731 connected between the first input node IN1 and a second terminal of the resonance capacitor Cr; a second switching device 732 connected between the first input node IN1 and a second terminal of the primary winding 721; a third switching device 733 connected between the second input node IN2 and the second terminal of the resonance capacitor Cr; and a fourth switching device 734 connected between the second input node IN2 and the second terminal of the primary winding 721.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. For example, although in the embodiments each transistor is illustrated to have two gate structures and three S/D electrodes, other configurations may also be used and each transistor can have any other suitable numbers of gate structures and S/D electrodes.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based multi-channel switching device having a plurality of transistors and comprising:
   a substrate;
   a buffer structure disposed over the substrate;
   a first nitride-based semiconductor layer disposed over the buffer structure;
   a second nitride-based semiconductor layer disposed over the first nitride-based semiconductor layer and having a bandgap greater than the bandgap of the first nitride-based semiconductor layer; and
   a plurality gate structures disposed above the second nitride-based semiconductor layer;
   a first passivation layer disposed on the second nitride-based semiconductor layer and covering the gate structures;
   a plurality of source electrodes disposed on the second nitride-based semiconductor layer and penetrating through the first passivation layer;
   a plurality of drain electrodes disposed on the second nitride-based semiconductor layer and penetrating through the first passivation layer;

a second passivation layer disposed on the first passivation layer and covering the source electrodes and drain electrodes;
one or more conductive vias disposed within the second passivation layer;
a conductive layer disposed on the second passivation layer and patterned to form one or more conductive traces;
a protection layer disposed above the conductive layer and having one or more openings to expose one or more conductive pads to form a plurality of drain pads respectively corresponding to the plurality of transistors, a plurality of gate pads respectively corresponding to the plurality of transistors and at least one common source pad;
wherein
the gate structures, source electrodes and drain electrodes are grouped to form the plurality of transistors and arranged such that each gate structure disposed between a source electrode and drain electrode; and
each group of the gate structures are electrically interconnected and connected to at least one gate pad corresponding to each of the transistor;
each group of the drain electrode are electrically interconnected and connected to at least one drain pad corresponding to each of the transistor;
all groups of the source electrodes are electrically interconnected and connected to at least one common source pad.

2. The nitride-based multi-channel switching device according to claim 1, wherein each of the plurality of transistors comprises a heterojunction that is formed between first and second nitride-based semiconductor layers with a two-dimensional electron gas (2DEG) region adjacent to the heterojunction.

3. The nitride-based multi-channel switching device according to claim 1, wherein the buffer structure comprises:
at least one first layer of a doped nitride-based semiconductor compound at a top-most portion thereof; and
a second layer located between the substrate and the first layer and including a nitride-based semiconductor compound which has a composition different than the doped nitride-based semiconductor compound.

4. The nitride-based multi-channel switching device according to claim 3, wherein the doped nitride-based semiconductor compound of the buffer structure is a p-type gallium nitride-based semiconductor compound.

5. The nitride-based multi-channel switching device according to claim 4, wherein the p-type gallium nitride-based semiconductor compound is carbon-doped gallium nitride.

6. The nitride-based multi-channel switching device according to claim 1, wherein the first nitride-based semiconductor layer and the second nitride-based semiconductor layer comprise gallium.

7. The nitride-based multi-channel switching device according to claim 1, wherein the plurality of transistors is arranged in a one-dimensional array.

8. The nitride-based multi-channel switching device according to claim 1, wherein the plurality of transistors is arranged in a two-dimensional array.

9. A method for manufacturing a nitride-based multi-channel switching device having a plurality of transistors, the method comprising:
forming a buffer structure over a substrate;
forming a first nitride-based semiconductor layer disposed over the buffer structure;
forming a second nitride-based semiconductor layer disposed on the first nitride-based semiconductor layer;
disposing a gate semiconductor layer on the second nitride-based semiconductor layer and a gate electrode layer on the gate semiconductor layer, and patterning the gate semiconductor layer and the gate electrode layer to form one or more gate structures;
forming a first passivation layer on the second nitride-based semiconductor layer to cover the gate structures;
forming one or more openings in the first passivation layer to expose some regions of the second nitride-based semiconductor layer, disposing a source/drain electrode layer to cover the first passivation layer and exposed regions of the second nitride-based semiconductor layer, and patterning the source/drain electrode layer to form one or more source/drain electrodes penetrating through the first passivation layer and in contact with the second nitride-based semiconductor layer;
forming a second passivation layer on the first passivation layer to cover the source/drain electrodes;
forming one or more conductive vias within the second passivation layer;
forming a conductive layer on the second passivation layer and patterning the conductive layer to form one or more patterned conductive traces; and
forming a protection layer above the conductive layer and patterning the protection layer to form one or more openings to expose one or more conductive pads to form a plurality of drain pads respectively corresponding to the plurality of transistors, a plurality of gate pads respectively corresponding to the plurality of transistors and at least one common source pad;
wherein:
the plurality of gate structures, source electrodes and drain electrodes are grouped to form the plurality of transistors such that each transistor having at least one gate structure disposed between at least one source electrode and at least one drain electrode; and
each group of the gate structures are electrically interconnected and connected to at least one gate pad corresponding to each of the transistor;
each group of the drain electrode are electrically interconnected and connected to at least one drain pad corresponding to each of the transistor;
all groups of the source electrodes are electrically interconnected and connected to at least one common source pad.

10. The method according to claim 9, wherein each of the plurality of transistors is formed such that a heterojunction is formed between first and second nitride-based semiconductor layers with a two-dimensional electron gas (2DEG) region adjacent to the heterojunction.

11. The method according to claim 9, wherein forming the buffer structure comprises:
forming at least one first layer of a doped nitride-based semiconductor compound at a top-most portion thereof; and
forming a second layer located between the substrate and the first layer and including a nitride-based semiconductor compound which has a composition different than the doped nitride-based semiconductor compound.

* * * * *